(12) United States Patent
Anandan

(10) Patent No.: US 7,663,312 B2
(45) Date of Patent: Feb. 16, 2010

(54) FLEXIBLE OLED LIGHT SOURCE

(76) Inventor: Munisamy Anandan, 13009 Thome Valley Dr., Del Valle, TX (US) 78617

( * ) Notice: Subject to any disclaimer, the term of this patent is extended or adjusted under 35 U.S.C. 154(b) by 573 days.

(21) Appl. No.: 11/491,624

(22) Filed: Jul. 24, 2006

(65) Prior Publication Data
US 2008/0018244 A1   Jan. 24, 2008

(51) Int. Cl.
*H01J 1/62* (2006.01)
*H01J 63/04* (2006.01)

(52) U.S. Cl. ............... 313/511; 313/512; 313/498; 313/504; 313/506; 428/458; 428/473.5; 428/688; 428/689; 428/690

(58) Field of Classification Search ......... 313/504–506, 313/512, 498, 511; 428/458, 473.5, 688–690
See application file for complete search history.

(56) References Cited

U.S. PATENT DOCUMENTS 5,470,644 A * 11/1995 Durant ................. 428/209
6,091,194 A * 7/2000 Swirbel et al. ........... 313/498
6,835,950 B2 * 12/2004 Brown et al. ............. 257/40
2003/0062527 A1 * 4/2003 Kumar et al. ............. 257/79
2004/0046497 A1 * 3/2004 Schaepkens et al. ...... 313/506
2006/0226523 A1 * 10/2006 Foust et al. .............. 257/680

* cited by examiner

*Primary Examiner*—Nimeshkumar D Patel
*Assistant Examiner*—Thomas A Hollweg

(57) ABSTRACT

A flexible organic light emitting light source employing a flexible substrate that comprises a thin ployimide layer sandwiched by two metallic layers of which one metallic layer whose surface not in contact with polyimide layer contains OLED device that is coated with pore-free conformal barrier coating of inorganic oxide through Atomic Layer Epitaxy process and the barrier coating being completely encapsulated by a UV cured thick hard coat. The flexible device is sealed with a flexible plastic cover and the bottom external surface of metallic layer is integrated with a lamp drive circuit.

1 Claim, 7 Drawing Sheets

FLEXIBLE OLED LIGHT SOURCE

CROSS REFERENCE TO RELATED APPLICATION

U.S. Pat. No. 6,771,021—Cok et. al, Aug. 3, 2004
U.S. Pat. No. 7,034,479—Cok et. al, Apr. 25, 2006
U.S. Pat. No. 6,888,172—Ghosh, May 3, 2005
U.S. Pat. No. 6,994,906—Burroughs et. al, Feb. 7, 2006
U.S. Pat. No. 6,911,666—Voutsas et. al

OTHER PUBLICATIONS

1. "Hermeticity of polymeric lid sealants"—R. K. Traeger, Proceedings of 25$^{th}$ Electronics Components conference, pp. 361-367, April 1976
2. "Atomic Layer Deposition for Nanoscale Thin Films",—B. Pathangey and R. Solanki Vacuum Technology and Coatings, 1, 32 (2000).
3. "Thin glass-polymer system as flexible substrates for displays"—Andreas Weber, SID Digest of Technical papers, SID'02, 2002
4. 3"Full color OLED display using plastic substrate"—Ayakoyoshida et. al, SID Digest of Technical papers, SID'03, 2003
5. "Thin film encapsulated flexible OLED displays"—Anna B. Chwong et. al, SID Digest of Technical papers, SID'03, 2003
6. "Thin film encapsulation of OLED displays with NONON stack"—H. Lifka et. al, SID Digest of Technical papers, SID'04, 2004
7. "Thin film encapsulation of organic light emitting devices"—Amal Ghosh et. al, Journal of Applied Physics Letters, JAP, vol. 86, p. 22350, 2005
8. "Use of UV curable organic/inorganic hard coats for display applications"—Christopher Tronche et. al, SID Digest of Technical papers, SID'01, pp. 642-645, 2001
9. "Organic LEDs integrated with a-Si TFT on lightweight metal substrates"—C. C. Wu et. al, SID Digest of Technical Papers, p. 67-70, SID'97, 1997.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

1. Field of Invention

Organic Light Emitting Diode (OLED) technology is a new wave in light emission that can be applied to consumer lighting, flat panel displays and backlight for Liquid Crystal Displays (LCDs) and expected to challenge the most popular Liquid Crystal Displays (LCDs). A basic structure of OLED consists of an anode and a cathode between which is sandwiched a multi-layer organic thin film that generates light when electrons and holes recombine, as a result of sufficiently applied voltage, at the organic layer. The organic films and at least one metallic film are sensitive to the presence of water vapor and oxygen. As a result, one of the major problems faced by OLED is questionable longevity. The presence of oxygen and water vapor beyond one part per million (ppm) inside the device can deteriorate the performance of OLED. The material undergoes oxidation in the presence of oxygen and water vapor. Metallic film employed for cathode layer is sensitive for de-lamination under oxygen and water vapor environment. The end result is the marked decrease in brightness and formation and spreading of 'black spots' that is characterized by islands of no light emission. There are two mechanisms of degradation of light emission. One is due to the intrinsic nature of the organic materials that is responsible for overall uniform decrease in light emission and the other is due to the reaction of oxygen and water vapor that results in 'black spots'. Uniform degradation of light output, due to intrinsic aging nature of organic materials, can still render the device useful as a display with reduced brightness, whereas the black spots tend to spread, both during operation and storage, and thus render the device useless as a display or light source. Hence the latter mechanism is more serious than the first.

Foregoing demands serious consideration in the selection of substrates and hermetic sealing of OLED devices against oxygen and water vapor, particularly the materials employed for hermetic sealing medium. After the OLED has been processed and automatically transferred to the glove box, the seal process is normally carried out in moisture and oxygen controlled, less than 1 ppm, glove box. A mathematical model for the permeation of moisture through seals is given by (ref. 1—R. K. Traeger)

$$t=(V \cdot L/P \cdot A \cdot R \cdot T)\ln [(P_0-P_1)/(P_0-P_2)]$$

Where
t is the time in seconds to reach $P_2$
V is the free volume of the device ($cm^3$)
L is the diffusion path length or seal width (cm)
P is the permeability of the sealant (g/cm sec torr)
A is area of the seal exposed to the permeant ($cm^2$)
R is the gas constant (3465 torr $cm^3/°$ K $gH_2O$)
T is the temperature (° K)
$P_0$ is the external water vapor pressure in torr
$P_1$ is the initial internal water vapor pressure in torr
$P_2$ is the final internal water vapor pressure in torr FIG. 1, to follow in the description, gives permeation rates of moisture in various material Flexible 'OLED' Light source-specifications like, silicones, epoxies, fluorocarbons, glasses and metals for different thickness. It can be seen from the figure, the best material of choice is the metal.

In the foregoing description it is assumed that the substrates employed for OLED device is made of glass. Glass is adequate to offer very high barrier to moisture permeation. But glass is rigid and breakable in addition to being heavy in large thicknesses. Thin glass substrates in the range of 100 micron are extremely difficult to handle in manufacturing because of its vulnerability for breaking. Flexible substrates, mostly involving plastic, are not heavy besides being unbreakable. The major problem with flexible substrates is its high permeation rates for moisture. Description of permeation rates given in the foregoing paragraphs applies well for the material of the substrates as well. To reduce the moisture permeation through plastic substrates, barrier coatings have been employed on plastic substrates.

2. Description of Prior Art

Prior art dealt with the permeation of moisture through plastic flexible substrates by coating the substrates with inorganic barrier coatings such as $SiO_2$, $SiN_3$ and $Al_2O_3$. Multi-layer coatings (ref. 6) such as silicon nitride-silicon oxide-silicon nitride-silicon oxide were employed with polymer layers in between to reduce the stress of the multi-layer films exploiting plasma enhanced Chemical vapor deposition (PE-CVD) process. In another prior art (ref. 5), multi-layers consisting of alternate layers of flash evaporated and UV cured polyacralate and reactively sputtered $Al_2O_3$ in a stack of four pairs (5-7 micron) were employed on flexible substrate. None of these techniques satisfy the requirement of 'pore free films. With the result these approaches resulted in poor performance when the flexible substrates were subjected to 85° C. with a relative humidity of 85% (ref. 7).

A prior art directly related to flexible OLED light source (U.S. Pat. No. 6,771,021) by Cok et. al describes in detail about the light fixture and the organic stack employed for the light emitting layers but not about the flexible substrate itself. Cok et. al in another invention (U.S. Pat. No. 7,034,479) describes serially processed OLEDs for flexible area illumination source. Again this invention does not describe anything on barrier coating for the flexible substrate used for light source. Burroughs et. al describes (U.S. Pat. No. 6,994,906) flexible substrate employing glass layer of 200 micron thick and sandwiched between two plastic layers and in another embodiment glass layer is formed over plastic layer with glass layer facing OLED device and in still another embodiment glass layer is formed on the outer surface of plastic substrate with glass layer facing the ambient. The drawback here is the problem of brittleness of glass with a thickness of 200 micron and difficulty in handling in manufacturing especially large areas of >10" in diagonal size. Another prior art (U.S. Pat. No. 6,888,172) by Ghosh describes an unique transparent barrier layer on plastic substrate and this barrier layer is of inorganic oxide ($Al_2O_3$) in the thickness range of 20-70 nm deposited through Atomic Layer CVD process described in reference 2 above. The film deposited through this process is relatively 'pore-free' and is a superior process considering all other traditional thin film deposition processes but the process is slow. A thickness of 70 nm is insufficient to serve as a moisture barrier as per the permeation rates shown, for this thickness, in FIG. 1.

In another prior art (U.S. Pat. No. 6,911,666) by Voutsas et. al Titanium metal foil has been employed to build Active Matrix OLED. In this invention the metal foil is coated with $SiO_2$ and thin film transistors (TFTs) were processed on $SiO_2$. Metal foil is a 'bendable' substrate and not flexible and the high temperature compatibility for TFT process and thermal CVD process makes the metal foils costly.

In all the foregoing inventions, either the barrier layer employed for flexible substrate is porous or brittle for handling in manufacturing or slow process to build sufficient thickness if relatively 'pore-free'. In none of the foregoing inventions the substrates employed are flexible metallic substrates although costly 'bendable' metal foils have been used.

BRIEF SUMMARY OF THE INVENTION

According to the present invention flexible OLED light source can be made with low cost flexible plastic substrate sandwiched between two metallic layers and the light emitting OLED stack, being deposited on one surface of the metallic layer, can be encapsulated with a thin layer of $TiO_2$ through Atomic Layer Epitaxy (ALE) process followed by a thick organic/inorganic layers requiring no cover glass for the light source. Thus least permeation of moisture is achieved because of two metallic layers and the substrate is made 'flexible' rather than 'bendable' by sandwiching plastic substrate. The metallic layers laminated on the flexible polyimide is available commercially with a trade name of 'Pyralux' by Dupont for printed circuit manufacturing process and hence cost is low. As the metallic layers are not optically flat, the surface that will contain OLED stack needs to be polished prior to depositing cathode layer of OLED stack. After the completion of OLED stack including a transparent anode at the top, the top side is deposited with a conformal $TiO_2$ through ALE process to a thickness of 50 nm followed by a transparent organic-inorganic hard coat to a thickness of 12 micron obtained through spin coating or spray coating using commercially available material DeSolite 4D5-15 or 4D5-221' of DSM Desotech Inc. This coating is UV cured to obtain a hard surface that is scratch resistant. The flexible substrate 'Pyralux' uses copper as the metallic layers and hence a shearing operation at the edges of the sheet will almost close the edge of polyimide from being exposed to ambient. Thus polyimide is almost encapsulated by metallic layers and thus ambient moisture permeation to polyimide is minimal. Polyimide serves to increase the flexibility of the substrate and reduce the weight of substrate and hence the device.

It is an object of this invention to provide a flexible OLED light source employing a flexible substrate with minimum moisture permeation through it to protect OLED lighting device processed on the flexible substrate.

A further object of this invention is to provide encapsulation layers over OLED stack that act as efficient barrier for moisture permeation to protect the OLED lighting device.

Yet another object of this invention is to eliminate a cover glass by providing a thick hard coat over OLED lighting device so as to be scratch resistant.

Still further object of this invention is to provide a flexible OLED light source for backlighting Liquid Crystal Display (LCD) device with integrated backlight drive circuit to the back surface of the light source.

DETAILED DESCRIPTION OF DRAWINGS

Figure 1:
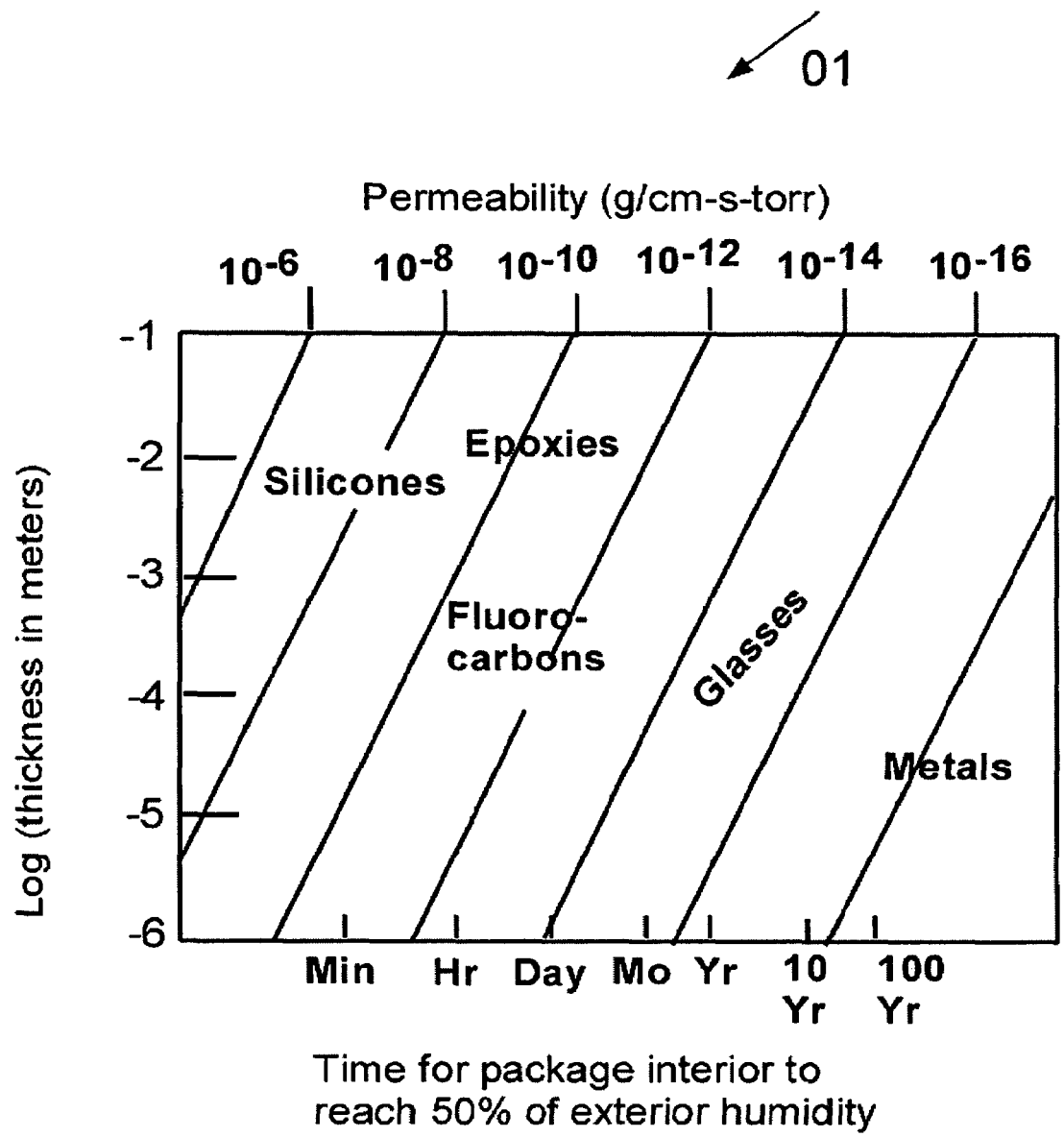
FIG. 1 is a graphical representation of the permeation of moisture through various materials for different thicknesses. It also shows the time taken to reach 50% of ambient moisture inside a device sealed by various materials with different thicknesses of materials.

FIG. 1 illustrates the permeation resistance of various materials employed for sealing moisture sensitive devices. It is important to notice that among the materials metals offer very high resistance (lowest permeation rate) for moisture permeation. It is also significant to note the major role played by thickness of various materials for decelerating the moisture permeation. Epoxies with a thickness of 1 micron can, within minutes, make the device to contain 50% of ambient moisture whereas it takes years for metals to make the device reach the same content of moisture. It is significant to note that the comparative time is months for glasses which fall under inorganic oxides such as $TiO_2$, $SiO_2$, $ZrO_2$, $Al_2O_3$ and many other oxides. As the thickness of these materials increases the time to reach 50% of ambient humidity also increases. For OLED devices, 50% level is total mortality of the device. For successful operation of OLED devices the moisture permeation rate should be less than $10^{-6}$ g/m²/day (ref. 3). So barrier thicknesses of several 10s of microns, preferably with metals, wherever possible are essential.

Figure 2:
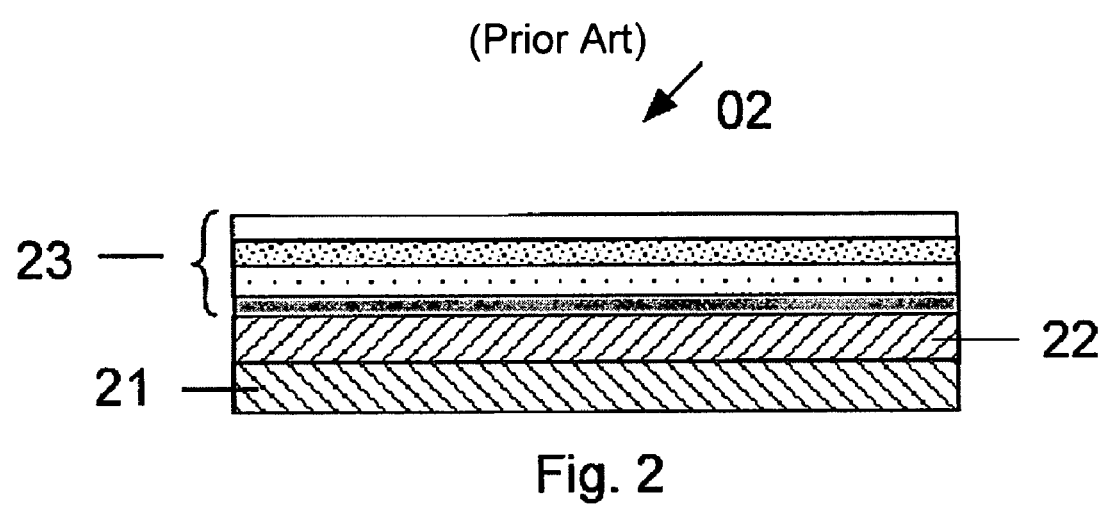
FIG. 2 is a cross section of a flexible substrate with OLED and with barrier coating according to one prior art.

FIG. 2 is a cross sectional view of a flexible OLED according to a prior art. The flexible substrate 21 is laminated with a glass layer 22 with a thickness of 200 microns and the OLED stack 23 is deposited on top of glass layer. The device is sealed to a top flexible substrate (not shown in FIG. 2) with similar lamination of glass layer. Glass layer of 200 micron thick is not flexible and is susceptible for breakage and cracks during manufacturing.

Figure 3:
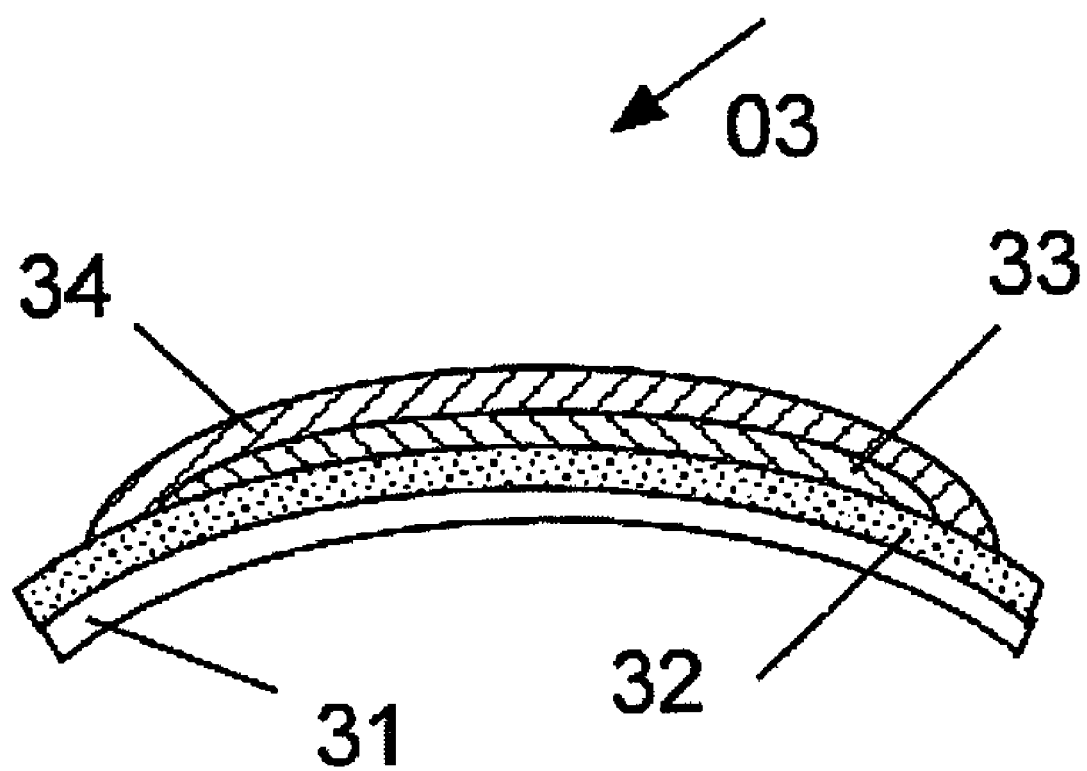
FIG. 3 is a cross section of a flexible substrate with OLED and barrier coatings according to another prior art.

FIG. 3 is a cross sectional view of a flexible OLED according to another prior art. The flexible substrate 31 is coated with a thin film barrier layer 32 up to a thickness of 70 nm and OLED stack is 33 is deposited over the thin film barrier layer 32 and the stack is encapsulated by a similar barrier layer 34 on top. The process of deposition of two thin film barrier layers is very slow due the nature of ALE process and these layers are so thin to offer moisture resistance for prolonged period of time.

Figure 4A:
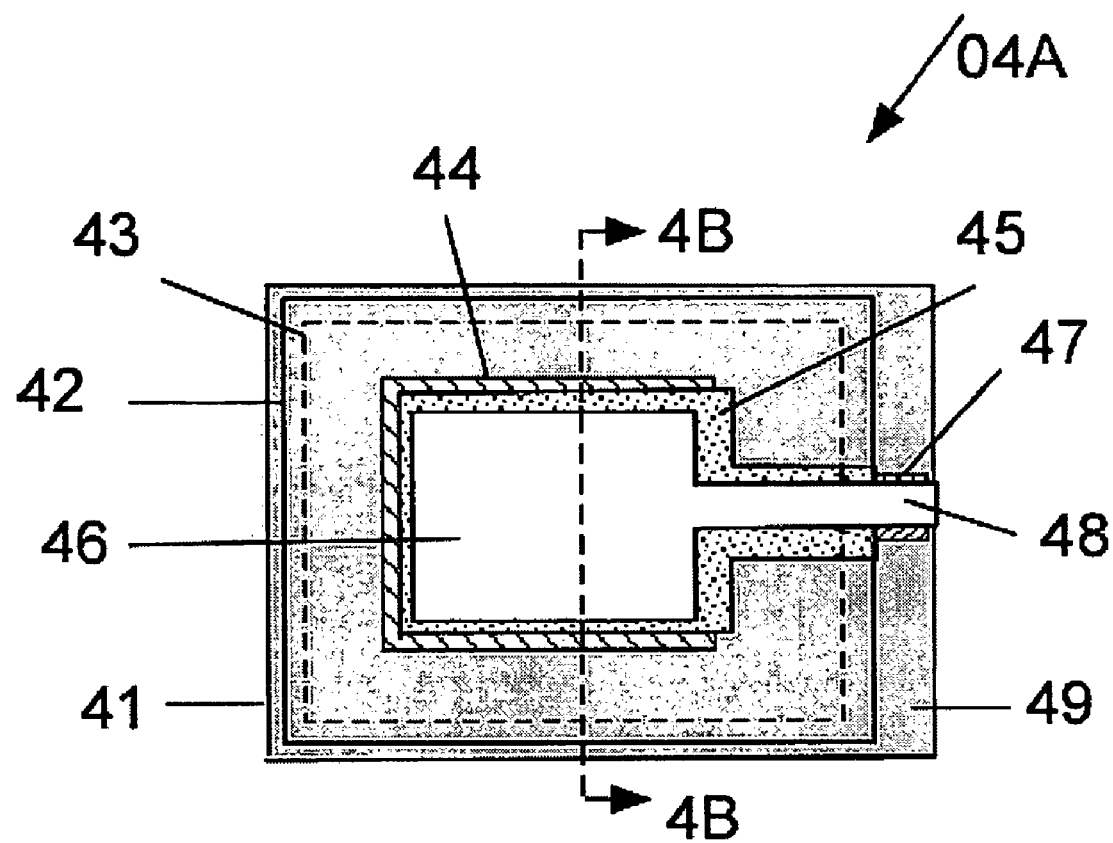
FIG. 4A is a plan view of flexible substrate with barrier coatings according to the present invention.
Figure 4B:
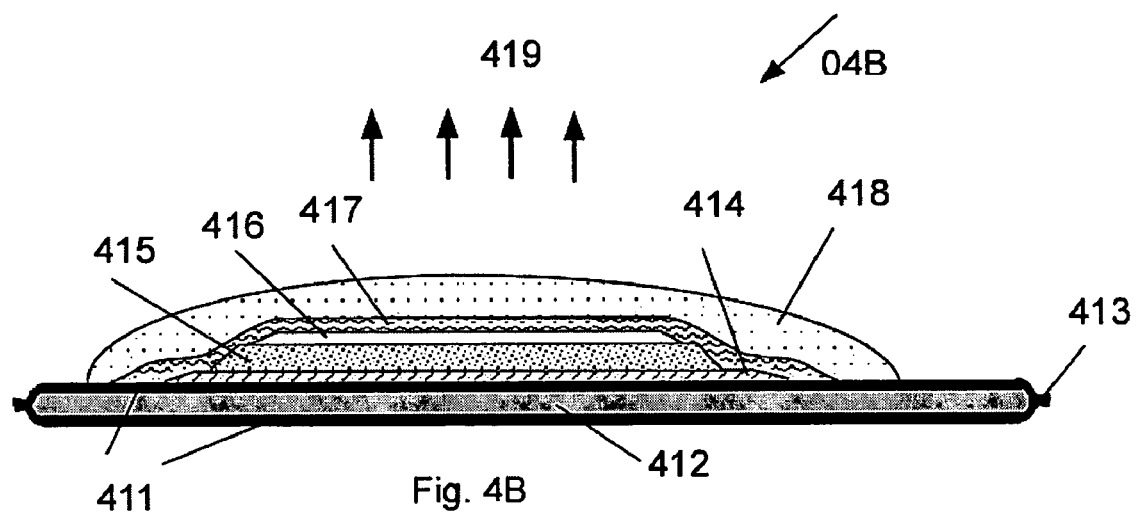
FIG. 4B is a cross sectional view of FIG. 4A according to the present invention.

FIG. 4 is a plan view of flexible OLED light source according to the present invention. Flexible substrate 41 comprises two metallic layers laminated on both sides of a polyimide substrate (better shown in FIG. 4B in cross section) over which is deposited a reflective cathode layer 44 consisting of Al/LiF with Al of 50000 A thick and LiF of 50 A followed by multi-layer organic stack 45 consisting of electron transport layer, host layer with dopants, hole transport layer and hole injection layer. The final anode layer 46 consists of a thin (5A) LiF followed by Indium Tin Oxide (ITO) layer. All these layers are deposited through vacuum evaporation except ITO layer which is sputtered. Covering the entire OLED stack is a TiO2 layer 43 formed through ALE process to a thickness in the range of 50 nm but at a temperature <110 C because of the temperature sensitive organic stack underneath. ALE process employed for TiO2 deposition over the OLED stacked substrate placed inside ALE chamber is the following:

The precursors for TiO2 deposition are: (1) Titanium tetrachloride and (2) Ozone. The temperature of the chamber is set around 1000 C. Report has appeared on the formation of TiO2 even at room temperature through ALE process The chemical reaction that takes place at this temperature is:

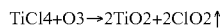
$TiCl_4 + O_3 \rightarrow 2TiO_2 + 2ClO_2\uparrow$

2ClO2 is flushed out of the chamber by a pulse of N2 gas injected in to the chamber and pumping it out. As the growth rate of ALE is a maximum of 10 nm/min, a thickness of only 5000 A of TiO2 is sufficient, as a hard coating on top of TiO2 is subsequently deposited according to the present invention.

Alternatively SiO2 deposition through ALE can also be done over OLED stack employing the following process:

The precursors for this deposition are: (1) Tetra Ethoxy Silane (2) Water vapor and the temperature to be maintained in the chamber is around 1000 C. The reaction that takes place to yield SiO2 is as follows:

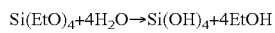
$Si(EtO)_4 + 4H_2O \rightarrow Si(OH)_4 + 4EtOH$

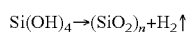
$Si(OH)_4 \rightarrow (SiO_2)_n + H_2\uparrow$

Hydrogen evolved during the reaction is flushed out by injecting N2 in to the chamber and pumping out.

Several alternative oxides, temperatures and thicknesses can be used in the above structure. For example for layer formed by ALE, i.e. TiO2, any of the following oxides can be substituted: $Al_2O_3$ or mixed $Al_2O_3$—$TiO_2$ or $Ta_2O_5$ or ZnO or $ZrO_2$ or $Y_2O_3$. The temperatures in the range of 50 C to 120 C can be used.

ALE process results in a nearly pore-free conformal film but the process is slow at a growth rate of 10 nm/min. Hence the process is not continued beyond 500 A. As 500 A of TiO2 is insufficient to be a moisture barrier for OLED, further coverage of the device is carried through a 'spin coating' process by spinning a hard coat layer 42 consisting of organic/inorganic hybrid hard coat 'DeSolite 4D5-15 or 4D5-221' of DSM Desotech Inc. A coating thickness as high as 10 micron could be obtained by this process after drying and UV curing with 300 mJ/cm2 of energy.

Masking process and sacrificial layer processes (not described here) are employed for defining the borders of all the layers including TiO2 and hard coat. This facilitates bringing the anode lead-out 48 over a dielectric layer 47 processed on metallic surface of the substrate 41. As the metallic layer 41 contains the cathode of OLED, any place on the metallic surface 41 can be used as cathode lead-out 49.

FIG. 4B is a cross sectional view taken from FIG. 4A and is clearly illustrating different layers. The flexible substrate is called by the trade name 'Pyralux' marketed by Dupont and it comprises two metallic layers 411, made of copper, sandwiching a polyimide layer 412. The thickness of each metallic layer is 35 microns and that of polyimide ranging from 12 microns to 25 microns. Polyimide has the following advantages:

Polyimide AP9151-R is used at continuous temperature of 150° C. for 1000 hrs. Its glass transition temperature is 220° C.

The moisture absorption of AP9151-R, as a bare film, is low. At environmental condition of 98% RH at 23 C, the water vapor absorption is just 0.8%. With Cu cladding on both sides the absorption will be considerably low.

Mechanical stability has been proven at 85 C/85% RH for a continuous operation for 500 hrs.

Chemically very stable for all processes.

Compatible with the expansion coefficient of Cu lamination and possess excellent adhesion to Cu.

Ease of tab bonding for electrical connections.

Preparing the substrate for flexible OLED light source if the Pyralux sheets are shear cut the edge of the Pyralux can be closed by copper as a pinch 413 as shown in FIG. 4B. This means if the sheet is baked well before shearing further moisture being absorbed from ambient by polyimide after shearing is minimal. Pyralux does not possess an optically flat copper surface and hence the copper surface that will subsequently face deposition of OLED stack needs to be optically polished and cleaned. OLED stack comprising reflective cathode 414 (Al/LiF), multi-layer organic layers 415, transparent anode 416 (ITO) are deposited followed by barrier layer 417 ($TiO_2$). A final hard coat 418 consisting of 'DeSolite 4D5-15 or 4D5-221' of DSM Desotech Inc is applied through spin coating and UV cured. The light 419 is emitted at the top signifying the OLED in this case is an 'up-emitting' structure as per the traditional terminology used in OLED technology.

Figure 5:
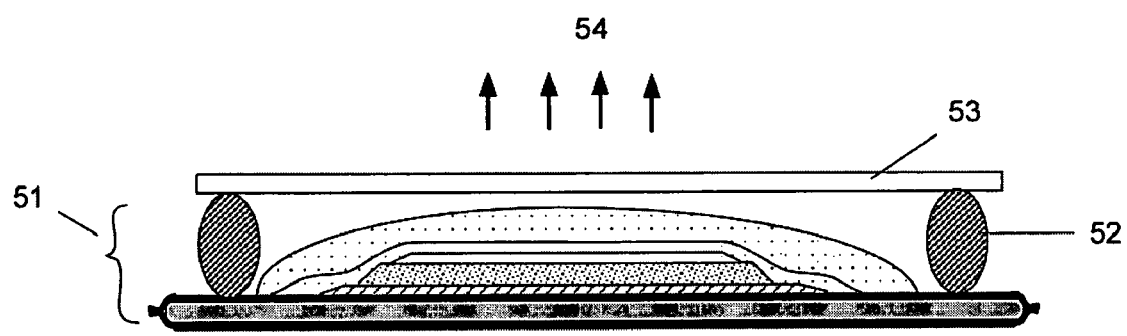
FIG. 5 is a cross sectional view of a flexible OLED lamp with flexible plastic cover.

FIG. 5 is a cross sectional view of the light source 51 that is sealed to a protective flexible cover 53 through a peripheral UV epoxy seal 52. The light rays 54 are emitted through transparent plastic cover 53 which can be made of 'Mylar' or 'Parylene'.

Figure 6:
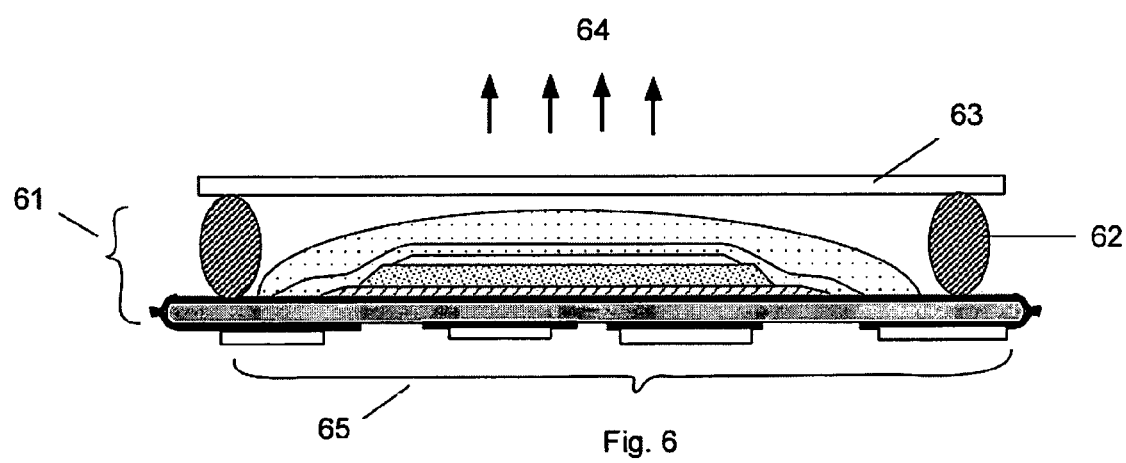
FIG. 6 is a cross sectional view of flexible OLED light source with lamp drive circuit integrated to the back surface of the flexible substrate containing metallic layer.

FIG. 6 is a cross sectional view of flexible light source 61 that is sealed to the transparent plastic cover 63 through a perimeter UV epoxy seal 62 and incorporated with a lamp drive circuit 65 at the back of the flexible substrate particularly at the outer surface of copper that can be patterned to mount drive components typical of flexible printed circuit board. The light 64 is emitted through the plastic cover at the top. In this case the moisture permeation resistance is offered by only one metallic layer with a thickness of 35 microns which is adequate.

From the foregoing description it is clear that the metal layers act as excellent moisture barriers with flexibility being obtained through polyimide that has superior thermal properties. A thick hard coat over TiO2 layer places less demand on the slow ALE process by accommodating low thickness of TiO2. Further the commercially available Pyralux can be used to integrate lamp drive circuit to the OLED light source.

It will be understood that one skilled in the art could modify the above basic design dimensions, geometries, sequence of assemblies. Various modification and variations can be made in the construction, configuration and/or operation of the present invention without departing from the scope or spirit of the invention. By way of example, copper lamination can be replaced by Cr lamination, Ni lamination or any other metal. Instead of lamination, the metal can be vacuum evaporated or sputtered. Instead of polyimide layer being sandwiched by two metal layers, Teflon can be sandwiched. Instead of depositing OLED stack directly on laminated metallic layer a dielectric layer can be formed on the metallic layer and the OLED stack can be deposited on the dielectric layer for the convenience of forming segmented or pixelated OLED devices.

Thus it is intended that the present invention covers the modifications and variations of the invention provided they come within the scope of the appended claims and their equivalents.

I claim:
1. A flexible OLED light source comprising:
a thin polyimide layer sandwiched between two metallic layers with one of the metallic layers whose surface, not contacting the said polyimide layer, containing an OLED device further comprising an OLED stack of thin film layers and the other metallic layer whose surface, not contacting the said polyimide layer, facing the ambient air;
said polyimide layer having a thickness in the range of 12 microns to 25 microns;
said metallic layers having thickness in the range of 10 microns to 50 microns;
said OLED device being coated with a conformal and pore-free dielectric barrier layer for preventing the permeation of moisture and oxygen in to the said OLED device;
said barrier layer together with the said OLED device being encapsulated with a thick inorganic-organic hard coat layer for serving as physical protection to the said light source;
said metallic layers providing additional metallic barrier for preventing moisture and oxygen in to the said device;
said metallic layer, facing the ambient air, additionally providing electrical connection to the cathode of the said OLED device;
said polyimide layer, metallic layers, OLED device, barrier layers and hard coat layers, being sealed to a transparent plastic cover for physical protection;
said polyimide layer, metallic layers, OLED device, barrier layers and hard coat layers, in combination inside the said plastic cover, functioning as a flexible OLED light source when the said OLED device is electrically driven with an electrical drive voltage.

* * * * *